(12) United States Patent
Liao et al.

(10) Patent No.: US 7,754,571 B2
(45) Date of Patent: Jul. 13, 2010

(54) METHOD FOR FORMING A STRAINED CHANNEL IN A SEMICONDUCTOR DEVICE

(75) Inventors: Ken Liao, Hsinchu (TW); Kuo-Hua Pan, Taichung (TW); Yun-Hsiu Chen, Hsinchu (TW); Syun-Ming Jang, Hsinchu (TW); Yi-Ching Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 74 days.

(21) Appl. No.: 11/592,204

(22) Filed: Nov. 3, 2006

(65) Prior Publication Data

US 2008/0124875 A1 May 29, 2008

(51) Int. Cl.
*H01L 21/336* (2006.01)

(52) U.S. Cl. ............... 438/300; 257/346; 257/E29.039; 257/E21.435

(58) Field of Classification Search .................. 438/199, 438/142, 197, 203, 255, 230, 300–302, 303–305; 257/346, E29.021, E29.039, E21.435, E21.431
See application file for complete search history.

(56) References Cited

U.S. PATENT DOCUMENTS

| | | | |
|---|---|---|---|
| 6,541,343 B1 | 4/2003 | Murthy et al. | |
| 6,621,131 B2 | 9/2003 | Murthy et al. | |
| 6,872,610 B1 | 3/2005 | Mansoori et al. | |
| 6,878,592 B1 | 4/2005 | Besser et al. | |
| 7,235,473 B2* | 6/2007 | Jawarani et al. | 438/592 |
| 2006/0199321 A1* | 9/2006 | Lo et al. | 438/197 |
| 2007/0196989 A1* | 8/2007 | Kim et al. | 438/300 |
| 2008/0061366 A1* | 3/2008 | Liu et al. | 257/336 |

* cited by examiner

*Primary Examiner*—W. David Coleman
*Assistant Examiner*—Su C Kim
(74) *Attorney, Agent, or Firm*—Birch, Stewart, Kolasch & Birch, LLP

(57) ABSTRACT

A method for forming a strained channel in a semiconductor device is provided, comprises providing of a transistor comprising a gate stack exposed with a gate electrode on a semiconductor substrate, a pair of source/drain regions in the substrate on opposite sides of the gate stack and a pair of spacers on opposing sidewalls of the gate stack. A passivation layer is formed to cover the gate electrode and spacers of the transistor. A passivation layer is formed to cover the gate electrode and the spacers. A recess region is formed in each of the source/drain regions, wherein an edge of the recess region aligns to an outer edge of the spacers. The recess regions are filled with a strain-exerting material, thereby forming a strained channel region in the semiconductor substrate between the source/drain regions.

20 Claims, 11 Drawing Sheets

METHOD FOR FORMING A STRAINED CHANNEL IN A SEMICONDUCTOR DEVICE

BACKGROUND OF THE INVENTION

1. Field of the Invention

The present invention relates to semiconductor fabrication, and more particularly to a method for forming a transistor with strained channel.

2. Description of the Related Art

In modern semiconductor devices, bulk silicon is used as a substrate. Higher operating speed and lower energy consumption can be achieved by size reduction of the semiconductor devices formed thereon. Reduction of device size, however, is limited by device physics and fabrication costs. Thus, in addition to physical device size reduction, a different method is required to achieve the goals of higher operating speed and lower energy consumption.

For this reason, a method using stress control in the channel region of a transistor to overcome the limitation of size reduction is presented. The method increases mobility of electrons and holes using additional stress to vary silicon lattice spacing.

In conventional methods, a tensile-strained silicon layer disposed on a SiGe layer under tensile stresses acting as a channel layer of an NMOS transistor and a compressive-strained SiGe layer under compressive stresses acting as a channel layer of a PMOS transistor are disclosed. Through the silicon layer under tensile stresses and the SiGe layer under compressive stresses acting as the channel region of a MOS transistor, mobility of electrons and holes can be increased and higher operating speed and lower energy consumption can be achieved.

Nevertheless, some problems exist in the described methods, for example, the process for simultaneously forming a silicon substrate under tensile stresses (n-channel layer) and a SiGe layer under compressive stresses (p-channel layer) is complicated and methods of selectively forming an NMOS channel layer and a PMOS channel layer are also difficult. In addition, dislocation or segregation of germanium (Ge) may occur when forming a SiGe layer with a high temperature treatment and the gate breakdown voltage property suffers.

Thus, the present invention provides a method for forming a MOS transistor with strained-channel, having enhanced strain on the channel region thereof by improving the location and design of stressors therein.

BRIEF SUMMARY OF INVENTION

A detailed description is given in the following embodiments with reference to the accompanying drawings.

Methods for forming a transistor with a strained channel are provided. An exemplary embodiment of a method for forming a strained channel in a semiconductor device comprises providing of a transistor comprising a gate stack exposed with a gate electrode on a semiconductor substrate, a pair of source/drain regions in the substrate on opposite sides of the gate stack and a pair of spacers on opposing sidewalls of the gate stack. A passivation layer is formed to cover the gate electrode and spacers of the transistor. A passivation layer is formed to cover the gate electrode and the spacers. A recess region is formed in each of the source/drain regions, wherein an edge of the recess region aligns to an outer edge of the spacers. The recess regions are filled with a strain-exerting material, thereby forming a strained channel region in the semiconductor substrate between the source/drain regions.

An exemplary embodiment of a method for forming strained channel in a semiconductor device comprising providing a transistor comprising a gate stack exposed with a gate electrode on a semiconductor substrate, a pair of source/drain regions in the substrate on opposite sides of the gate stack, and a pair of spacers on opposing sidewalls of the gate stack. A conformal passivation layer is formed over the semiconductor substrate, the spacers and the gate stack. A resist pattern is formed on a portion of the passivation layer, substantially covering the gate stack, wherein edges of the resist pattern forms between to an outer and an inner edge of the spacers corresponding to the gate stack. The passivation layer and the semiconductor substrate exposed by the resist pattern are etched to form a recess region in each of the source/drain regions, wherein an edge of the recess region aligns to the outer edge of the spacers. The resist pattern is removed and leaves a patterned passivation layer covering the gate electrode and the spacers. The recess regions are filled with a strain-exerting material, thereby forming a strained channel region in the semiconductor substrate between the source/drain regions.

An exemplary embodiment of a transistor with a strained channel comprises providing of a semiconductor substrate with a gate stack over a part thereof, wherein the gate stack comprises a gate dielectric layer, a gate electrode and a mask layer sequentially formed over the semiconductor substrate. A pair of lightly doped source/drain regions is formed in the semiconductor substrate on opposite sides of the gate stack. The mask layer is removed to expose the gate electrode of the gate stack. A pair of spacers are formed on opposing sidewalls of the gate stack and the semiconductor substrate. A pair of heavily doped source/drain regions is formed in the semiconductor substrate on opposite sides of the gate stack. An annealing process is formed on the lightly and heavily doped source/drain regions, forming a pair of source/drain regions the semiconductor substrate on opposite sides of the gate stack. A conformal passivation layer is formed over the semiconductor substrate, the spacers and the gate electrode. A resist pattern is formed on a portion of the passivation layer, covering the gate electrode and the spacers, wherein edges of the resist pattern align to outer edges of the spacers from the gate electrode. The passivation layer and the substrate thereunder exposed by the resist pattern are etched to form a recess region in each of the source/drain regions, wherein an edge of the recess region aligns to the outer edge of the spacer. The resist pattern is removed and leaves a patterned passivation layer covering the gate electrode and the spacers. The recess regions are filled with a strain-exerting material, thereby forming a transistor with a strained channel region formed in the semiconductor substrate between the source/drain regions thereof.

BRIEF DESCRIPTION OF DRAWINGS

The present invention can be more fully understood by reading the subsequent detailed description and examples with references made to the accompanying drawings, wherein.

DETAILED DESCRIPTION OF INVENTION

Figure 1:
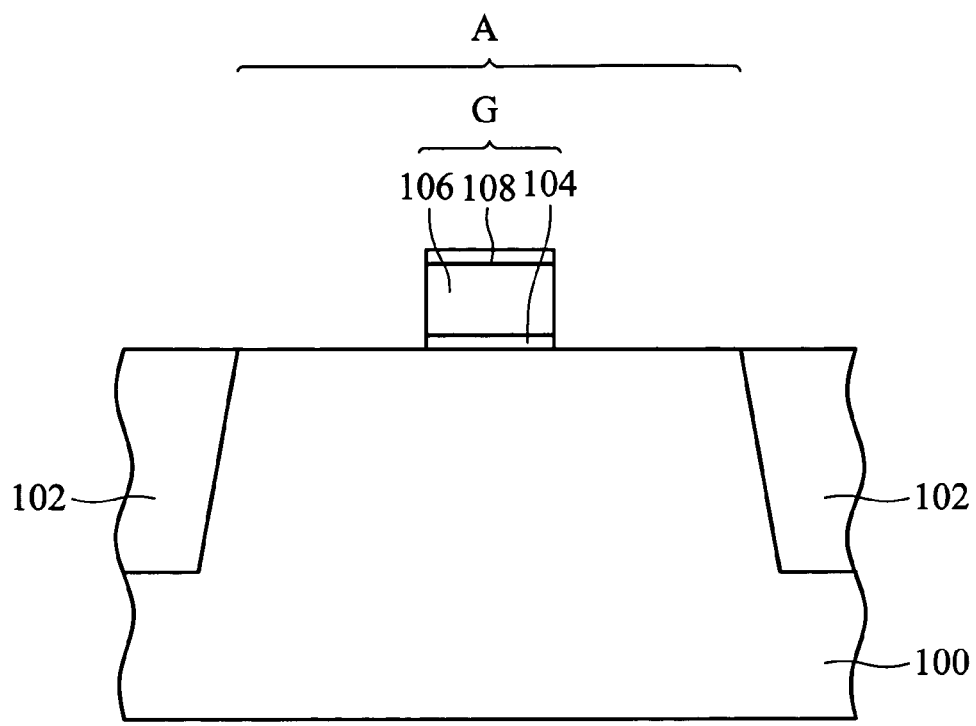
FIGS. 1-4 are schematic cross-sections illustrating a method for forming MOS transistor with strained-channel known to the inventors.

The following description is of the best-contemplated mode of carrying out the invention. This description is made for the purpose of illustrating the general principles of the invention and should not be taken in a limiting sense. The scope of the invention is best determined by reference to the appended claims.

Referring now to the drawings, FIGS. 1-4 demonstrate a method known to the inventors of forming a MOS transistor with strained channel. This is not prior art for the purpose of determining the patentability of the present invention. This merely shows a problem found by the inventors.

As shown in FIG. 1, a substrate 100 is provided. The substrate 100 may comprise a plurality of active areas A for forming devices thereon defined by a plurality of isolation regions 102 formed in the substrate 100, however, an active region A defined by two adjacent isolation regions 102 shown in FIG. 1 is provided to simplify the description. The substrate 100 comprises a first semiconductor material such as elemental, alloy or compound semiconductor material and is preferably an elemental semiconductor material such as silicon. The substrate 100 is formed with a first conductivity type such as N type or P type. The isolation regions 102 can be, for example, conventional shallow trench isolation (STI) structures as shown in FIG. 1. Next, a gate stack G including a gate dielectric layer 104, a gate electrode layer 106, and a mask layer 108 sequentially stacked over a portion of the substrate 100 is formed in the active region A.

Referring to FIG. 1, the gate stack G is formed by sequentially forming a layer of dielectric material (not shown), a layer of conductive material (not shown) and a layer of mask material (not shown) over the substrate 100. The mask material is then patterned to form the mask layer 108 for defining the gate electrode layer 106 and the gate dielectric layer 104, and the layers of conductive material and the dielectric material are subsequently etched using the mask layer 108 as an etching mask, thereby forming the gate electrode 106 and the gate dielectric layer 104 with the mask layer 108 formed thereon. Thus, the gate electrode layer 106 is electrically isolated from the channel region by the gate dielectric layer 104.

Figure 2:
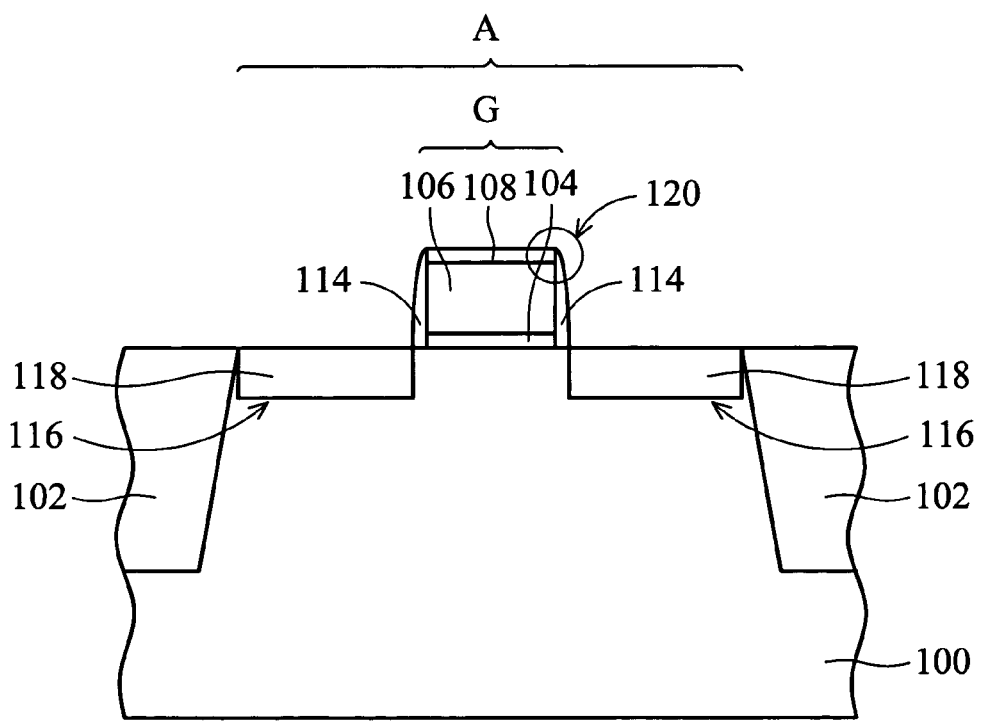

In FIG. 2, dummy spacers 114 are then formed on opposite sidewalls of the gate stack G. The dummy spacers 114 can be a composite bi-layer comprising an oxide layer and a nitride layer. Next, photolithography and sequential etching (not shown) are performed on the substrate 100, forming recesses 116 in the substrate 100 on opposite sides of the gate stack G. Next, the recesses 116 are filled with a second semiconductor material 118 having a different natural lattice constant than that of the first semiconductor material of the substrate 100 through a selective deposition process (not shown). The selective deposition process can be, for example, chemical vapor deposition, ultra-high vacuum chemical vapor deposition (UHV-CVD), or molecular beam epitaxy. The second semiconductor material 118 can be elemental, alloy or compound semiconductor and is preferably an alloy semiconductor material including silicon and germanium, silicon and carbon or the combination of silicon, germanium and carbon. The second semiconductor material 118 formed in the recesses 116 function as stressors inducing strain to the channel region formed in the substrate 100 therebetween. During the photolithography and etching for forming the recesses 116, however, portions of the dummy spacers 114 formed in the upper corner regions 120 may be damaged and a portion of the gate electrode 106 in the upper corner regions 120 are exposed. Once exposed, the exposed portion of the gate electrode layer 106 may react in the selective deposition process during the selective deposition process for filling the second semiconductor material 118, thereby forming an undesired protrusion (not shown) in the corner region 120, namely the mushroom issue.

Figure 3:
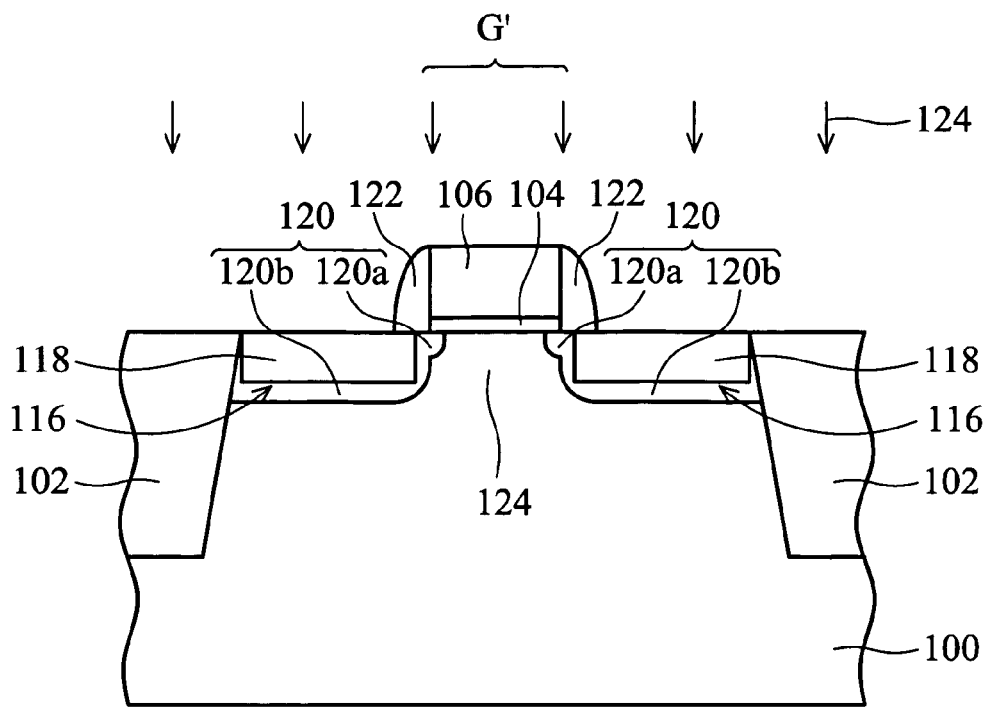

In FIG. 3, the dummy spacers 114 illustrated in FIG. 2 and the mask layer 108 are then removed, leaving a gate stack G' comprised of the gate dielectric layer 104 and the gate electrode layer 106. Next, a first ion implantation (not shown) is performed to oppositely form a pair of source/drain extension regions 120a of a second conductivity type in the substrate 100 adjacent to the gate stack G', using the gate stack G' as an implant mask. The second conductivity type of the source/drain extension regions 120a can be P type or N type and is opposite to the first conductivity type of the substrate 100. Next, spacers 122 are then formed on opposite sidewalls of the gate stack G'. The spacers 122 can be formed of a composite bi-layer of oxide and nitride or a single layer of nitride. Next, a second ion implantation 124 is performed to form a pair of heavily doped source/drain regions 120b of a second conductivity type in the substrate 100 adjacent to the gate stack G', using the gate stack G' and the spacers 122 as an implant mask. The second conductivity type of the source/drain extension regions 120a is opposite to the first conductivity type of the substrate 100. Typically, after implantations for forming the source/drain extension regions 120a and the heavily doped source/drain regions 120b, a source/drain annealing process is performed to thereby form source/drain regions 120 including the above mentioned source/drain related regions in the substrate 100, thereby completing a MOS transistor with strained channel illustrated in FIG. 3.

Figure 4:
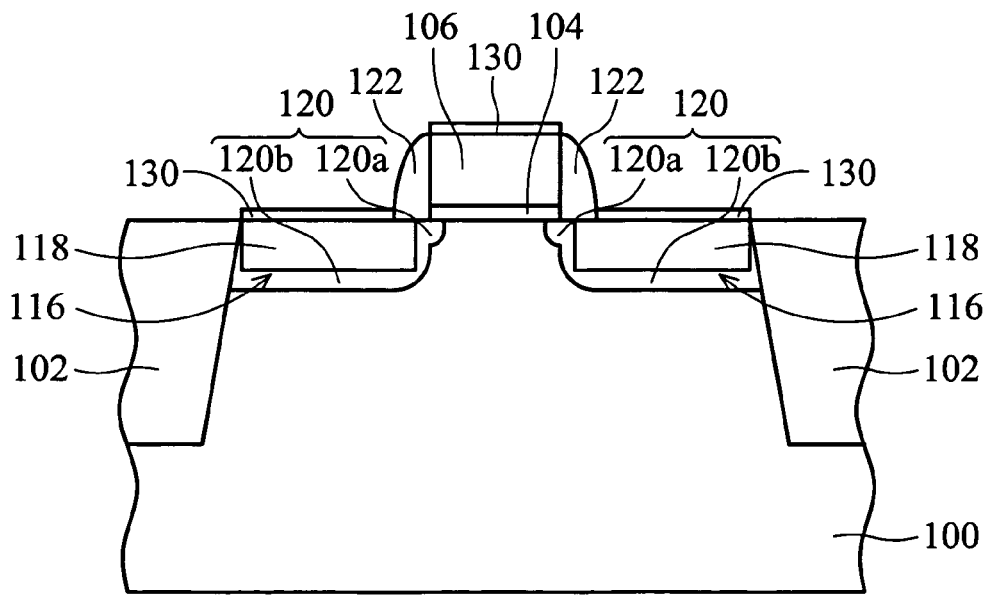

Typically, for the purpose of reducing contact resistance of the source/drain regions 120 and the gate electrode layer 106, a conventional silicide process (not shown) is next performed to respectively form a metal silicide layer 130 over the gate electrode layer 106 and the surface of the source/drain regions 120, as shown in FIG. 4.

Nevertheless, the method illustrated in FIGS. 1-4 has some drawbacks. First, as mentioned, use and removal of the dummy spacers and the mask layer often cause deformation of the gate electrode layer and generates undesired mushroom issue. Second, since the source/drain annealing is performed after formation of the stressors formed in the substrate, strain induced to the channel region between the stressors is inevitably relaxed, and other effects such misfit dislocations between the stressors and the substrate and dopant diffusion to the gate dielectric layer can also occur, thus ruining performances of such MOS transistor.

To solve these drawbacks, an improved method for forming a transistor with strained-channel, for example a MOS transistor with strained-channel, is provided, as illustrated in FIGS. 5-10.

Figure 5:
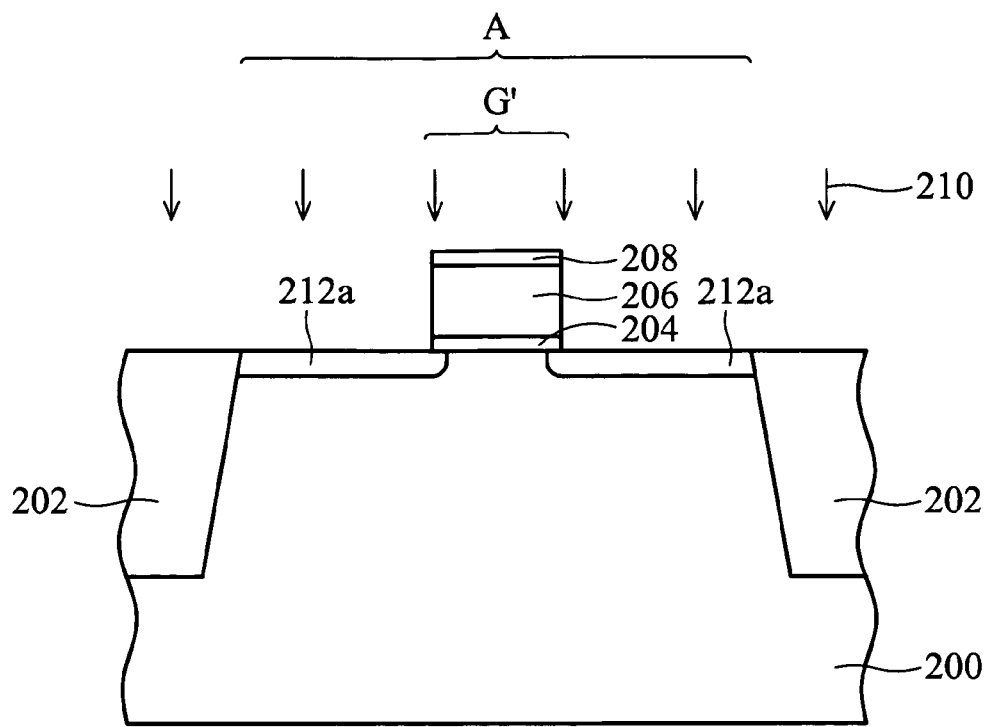
FIGS. 5-10 are schematic cross-sections illustrating a method for forming a transistor with strained-channel according an embodiment of the invention.

As shown in FIG. 5, a substrate 200 of a first semiconductor material and a first conductivity type is provided. The substrate 200 may comprise a plurality of active areas A for forming devices thereon defined by a plurality of isolation regions 202 formed in the substrate 200, however an active region A defined by two adjacent isolation regions 202 shown in FIG. 5 is provided to simplify the description. The first semiconductor material of the substrate 200 can be elemental, alloy or compound semiconductor material and is preferably an elemental semiconductor material such as silicon. The first conductivity type of the substrate 200 can be N type or P type. The isolation regions 202 can be, for example, a conventional shallow trench isolation (STI) region. Next, a gate stack G including a gate dielectric layer 204, a gate electrode layer 206, and a mask layer 208 sequentially stacked over a portion of the substrate 200 is formed in the active region A. The gate dielectric layer 204 can be formed by thermal oxidation, chemical vapor deposition, physical vapor deposition, or other known techniques. The gate dielectric layer 204 can be silicon dioxide, silicon nitride, silicon oxynitride, or combinations thereof with a thickness from about 10 Å to 60 Å. The gate dielectric layer 204 can also be a high permittivity (high-k) material with a relative permittivity greater than 8, having an equivalent oxide thickness of between about 10 Å to 60 Å. The gate electrode layer 206 can be polycrystalline-silicon (poly-Si), poly-crystalline silicon-germanium (poly-SiGe), refractory metal such as molybdenum or tungsten, compounds such as titanium nitride, combinations thereof, or other conductive material. The mask layer 208 can be silicon nitride, silicon dioxide or silicon oxynitride formed by chemical vapor deposition (CVD).

Referring to FIG. 5, the gate stack G is formed by sequentially forming a layer of dielectric material (not shown), a layer of conductive material layer (not shown) and a layer of mask material (not shown) over the substrate 200. The mask material layer is then patterned to form a mask layer 208 for defining layers of the dielectric material and conductive material. The layers of the dielectric material and conductive material are subsequently etched, using the mask layer 208 as an etching mask, to form the gate electrode layer 206 and the gate dielectric layer 204 with the mask layer 208 formed thereon. Thus, the gate electrode layer 206 is electrically isolated from the channel region by the gate dielectric layer 204. Next, a first ion implantation 210 is performed to form a source/drain extension region 212a of a second conductivity type in the substrate 200 on opposite sides of the gate stack G, using the gate stack G as an implant mask. The second conductivity type of the source/drain extension regions 212a can be P type or N type and is opposite to the first conductivity type of the substrate 200.

Figure 6:
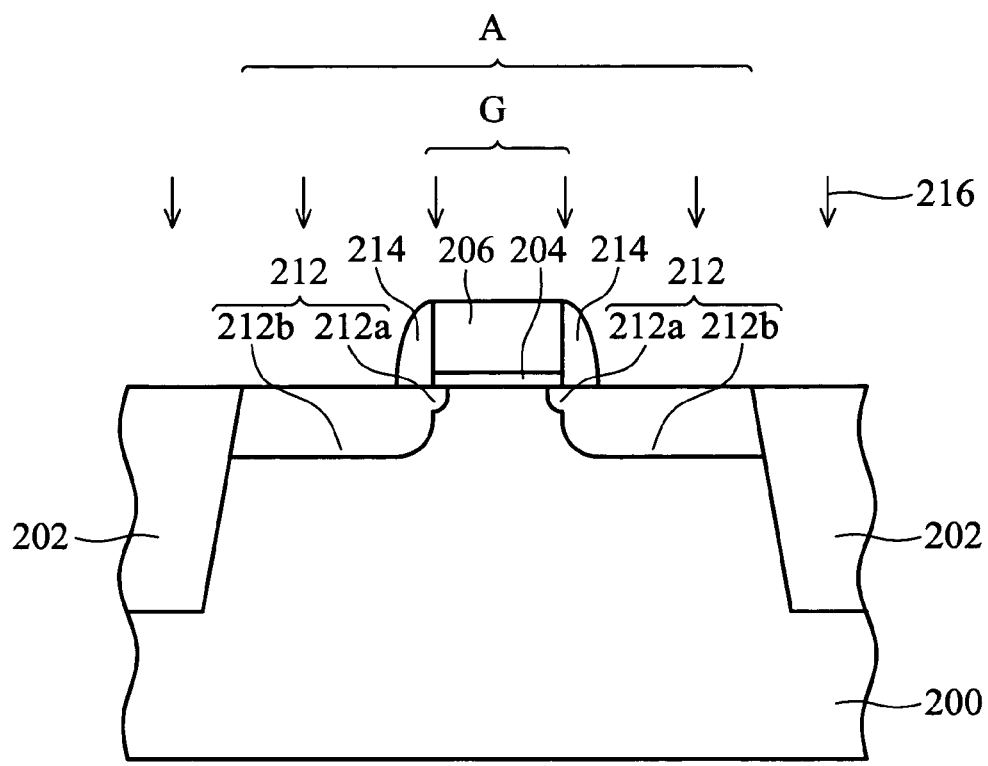

In FIG. 6, the mask layer 208 is next removed and leaves a gate stack G' comprised of the gate dielectric layer 204 and the gate electrode layer 206 formed over the substrate 200. Next, spacers 214 are formed on opposite sidewalls of the gate stack G'. The spacers 214 can be a composite bi-layer comprising an oxide layer and a nitride layer or a single layer comprising a nitride layer. Next, a second ion implantation 216 is performed to form a heavily doped source/drain regions 212b of a second conductivity type on the opposite side of the substrate 200 adjacent to the gate stack G', using the gate stack G' and the spacers 214 as an implant mask. A source/drain annealing is then performed to thereby form a source/drain region 212 including the above mentioned source/drain related components formed in the substrate 200, thereby completing a MOS transistor as shown in FIG. 6.

Figure 7:
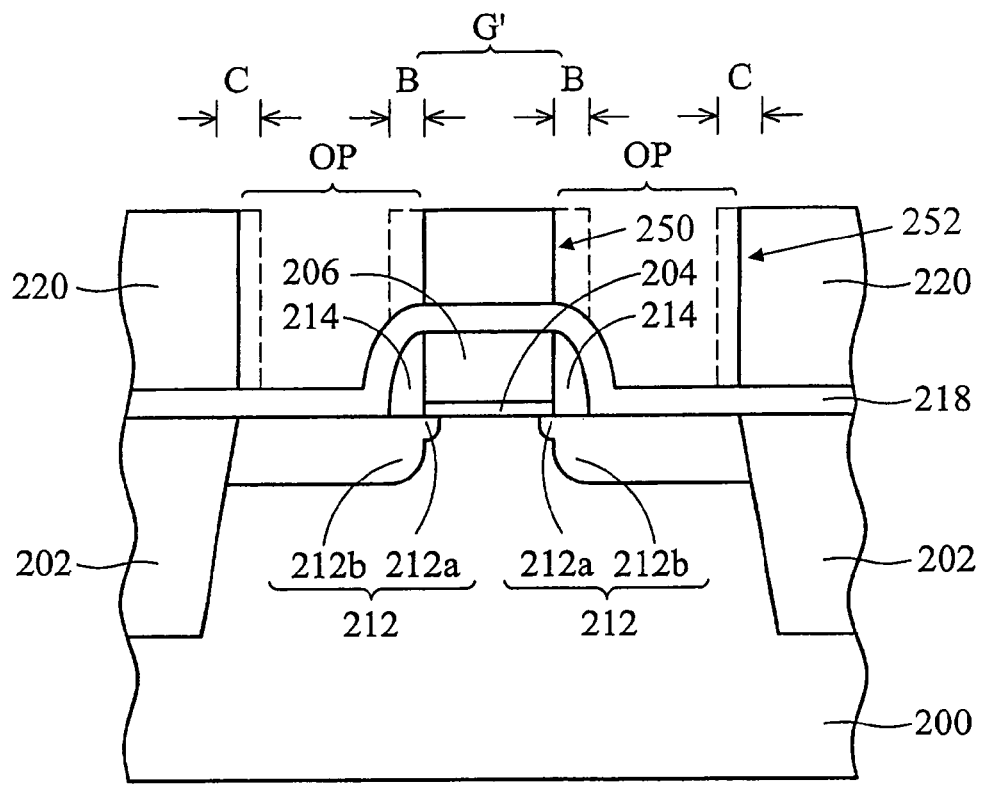

FIG. 7, a passivation layer 218 is formed over the substrate 200, conformally covering the gate stack G' and the spacers 214 thereon. The passivation layer 218 with a thickness of about 20 Å to 250 Å can be formed by methods such CVD. The passivation layer 218 may comprise silicon oxide, silicon nitride, silicon oxynitride, or combinations thereof. Next, a resist layer 220 is blanketly formed on the passivation layer 218 and patterned to form openings OP. The openings OP respectively expose a portion of the passivation layer 218 on opposite sides of the gate stack G'. Herein, the part of the patterned resist layer 220 formed over the gate stack G' and the spacers 214 at least covers the passivation layer 218 over the gate electrode 206 of the gate stack G', having an edge 250 substantially formed on or between the interior and outer edges of the spacers 214 corresponding to the gate stack G, shown as a region B in FIG. 7. In addition, the portion of the patterned resist layer 220 formed over the isolation region 202 at least covers the passivation layer 218 over thereof, having an edge 252 substantially aligning to an edge of the isolation region 202 corresponding to the gate stack G', and may further extend toward the gate stack G', shown as a region C in FIG. 7. As shown in FIG. 7, the region B has a width of about 230 Å to 600 Å corresponding to an edge of the gate electrode 206 and the region C has a width of about −900~900 Å corresponding to an edge of the isolation region 202. Therefore, formation of such a patterned resist layer 220 allows wider overlay windows and can be easily achieved by conventional photolithography techniques. This is particularly an advantage while a width of the gate stack G' is reduced to micrometer dimension.

Figure 8:
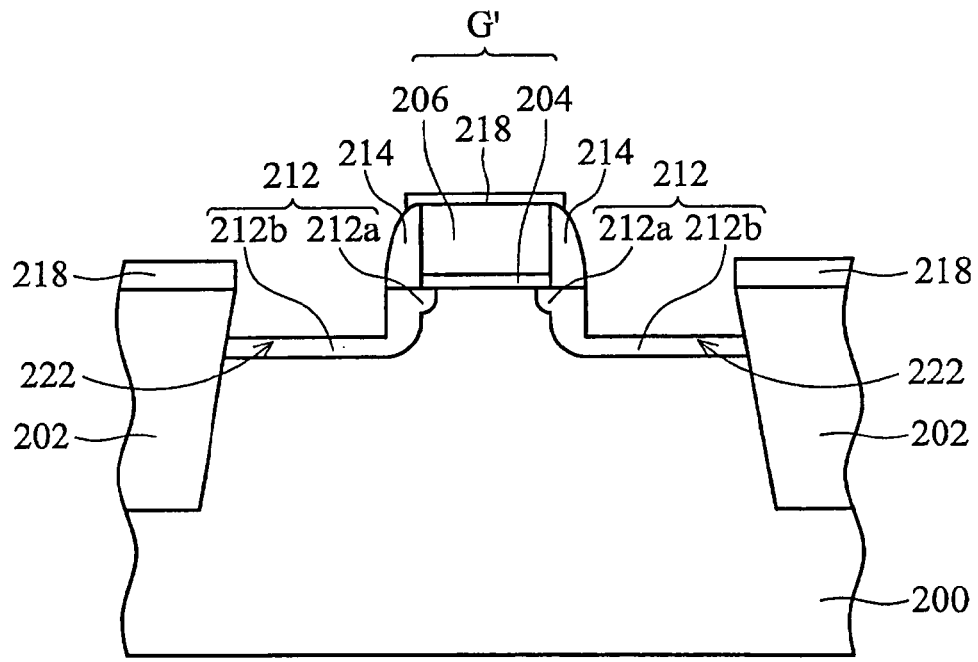

In FIG. 8, an etching (not shown) is next performed and the passivation layer 218 and portions of the substrate 200 exposed by the openings OP is removed, respectively forming a recess 222 in each of the source/drain regions 212. An edge of the recess 222 region aligns to the outer edge of the spacers and another edge of the recess 222 substantially aligns to an edge of the isolation region 202. During the above etching, the resist layer 220 (not shown) and the passivation layer 218 thereunder is partially etched and the remaining passivation layer 218 is left over only a portion of the gate stack G' and the spacers 214 and the isolation regions 202 after removal of the resist layer 220.

Figure 9:
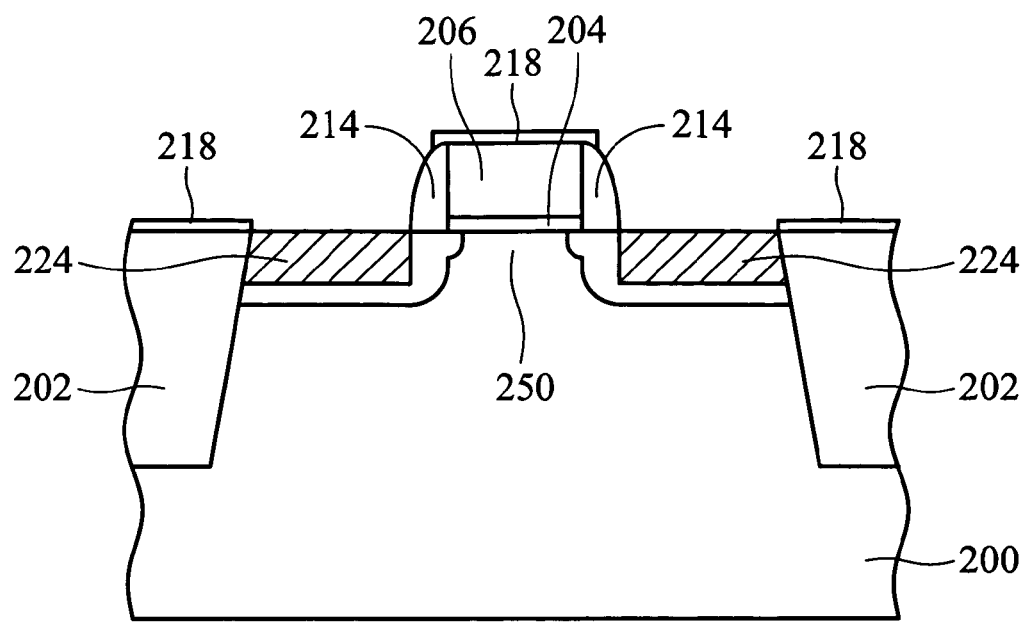

In FIG. 9, the recesses 222 are then filled with a second semiconductor material 224 having a different natural lattice constant than that of the first semiconductor material of the substrate 200 through an selective deposition process (not shown) such as chemical vapor deposition, ultra-high vacuum chemical vapor deposition (UHV-CVD), or molecular beam epitaxy, functioning as stressors for exerting strain to the channel region 250 between the source/drain regions 212. The second semiconductor material 224 can be elemental, alloy or compound semiconductor and is preferably an alloy semiconductor material including silicon and germanium, silicon and carbon or the combination of silicon, germanium and carbon. During the above selective deposition process for filling the recesses 222, the remaining passivation layer 218 prevents undesired selective deposition near the gate electrode 208, thus no gate electrode with mushroom issues is formed. In addition, during the selective deposition process for filling of the second semiconductor material 222, dopants of a second conductive type are in-situ doped in the second semiconductor material 224 with similar concentration and the doping concentration of the source/drain regions 212 therein can therefore be maintained.

Figure 10:
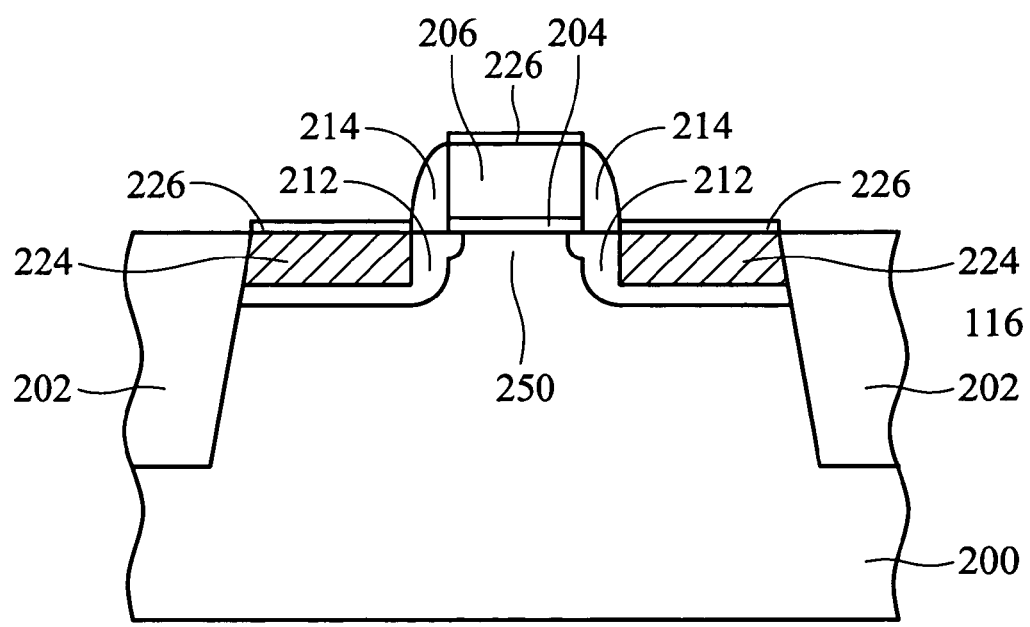

Next, the remaining passivation layer 218 over the substrate 200 is removed and a conventional silicide process (not shown) can be optionally performed to respectively form a metal silicide layer 226 over the gate electrode layer 206 and the surface of the source/drain regions 212 for the purpose of reducing contact resistances of the source/drain regions 212 and the gate electrode 206, as shown in FIG. 10.

Through the method illustrated in FIGS. 6-10, an exemplary MOS transistor with a strained channel region 250 and without the mentioned mushroom issue is obtained. In the MOS transistor having strained channel shown in FIGS. 9 and 10, the substrate 200 preferably comprises silicon and the second semiconductor material 224 preferably comprises a semiconductor material such as a silicon-germanium (SiGe), with a natural lattice constant greater than that of substrate 200. The second semiconductor material 224 now functions as a stressor and exerts a compressive stress (not shown) in a lateral source/drain direction and tensile stress (not shown) in a vertical direction in the substrate 200 of the strained-channel region, resulting in strained channel region 250 under a compressive strain in the source/drain direction and tensile strain in the vertical direction. Hole mobility in the strained-channel region 250 is significantly enhanced, enhancing the drive current when the MOS transistor with strained channel forms as a P-channel MOS transistor.

Further, the substrate 200 preferably comprises silicon and the second semiconductor material 224 preferably comprises silicon-carbon (SiC), with a natural lattice constant smaller than that of substrate 200. Therefore, the second semiconductor material 224 now functions as a stressor and exerts a tensile stress (not shown) in a lateral source/drain direction and compressive stress (not shown) in a vertical direction on the strained channel region 250, resulting in strained channel region 250 under a tensile strain in the lateral source/drain direction and compressive strain in the vertical direction. Electron mobility in the strained-channel region 250 is significantly enhanced, enhancing the drive current when the strained-channel transistor has an N-channel transistor structure.

Still referring to FIGS. 9-10, the substrate 200 is N-type doped when the strained-channel MOS transistor is a P-channel MOS transistor, or P-type doped when the strained-channel transistor is an N-channel MOS transistor.

Moreover, the stressors of the MOS transistor are formed after formation of the source/drain regions and in-situ doped with dopants having the same conductivity type as that of the source/drain regions. In addition, P-type dopant diffusion to the gate dielectric layer, for example boron diffusion issues, can also be avoided since no additional implantation is performed on the gate electrode and the source/drain regions after formation of the stressors. Therefore, strain on the channel region of the MOS transistor induced by the stressors will not be relaxed and performance of the MOS transistor can thus be enhanced.

The exemplary embodiment of the method for forming the MOS transistor having strained channel described through FIGS. 5-10 is illustrated as a method for forming a MOS transistor but not limited thereto. The described method can be also applied in a standard CMOS process for forming a CMOS device having both NMOS and PMOS transistors formed over a substrate. FIGS. 11-16 are schematic cross-sections showing a method for forming a CMOS device with strained-channels.

Figure 11:
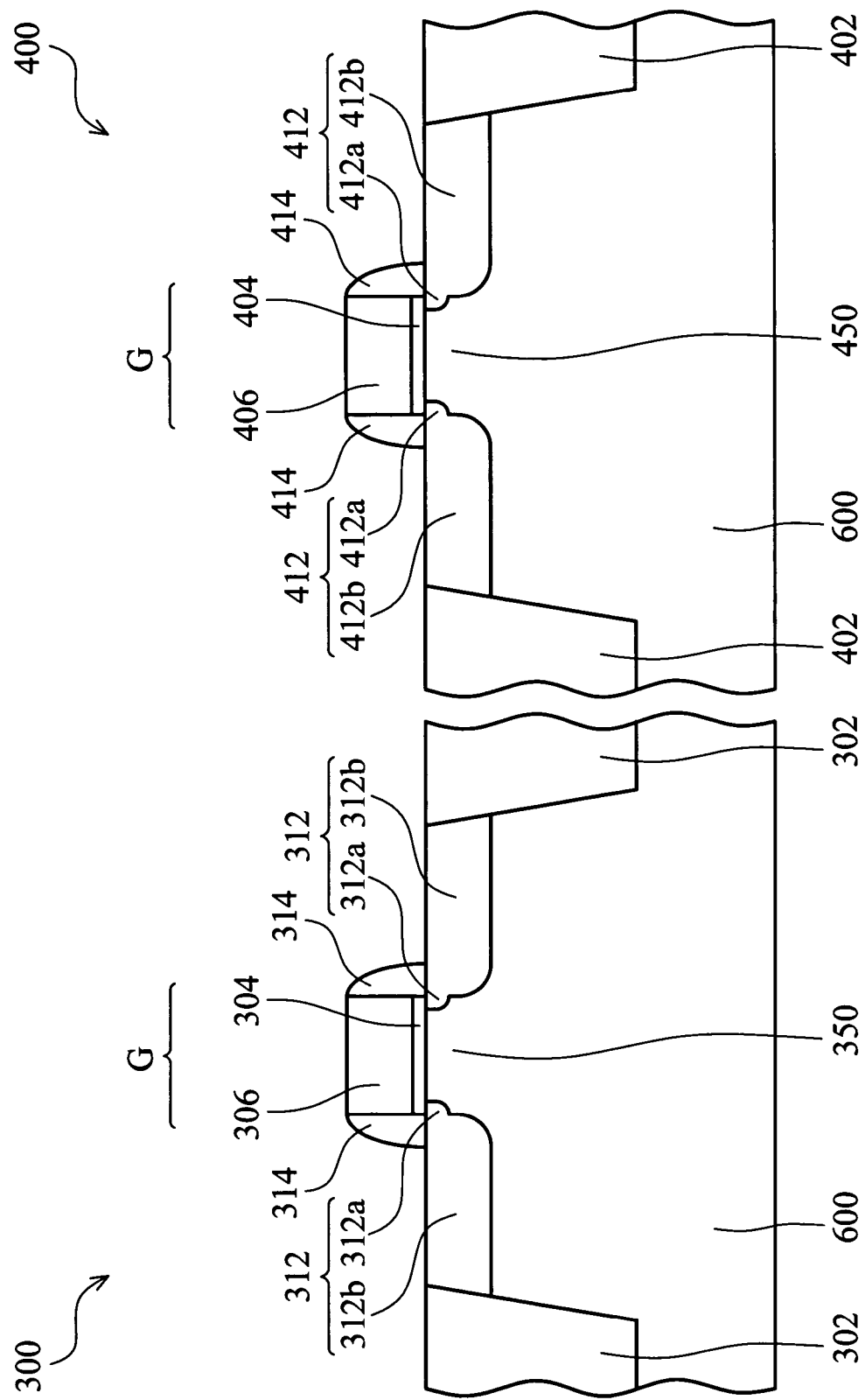
FIG. 11-16 are schematic cross-sections illustrating a method for forming a CMOS device with strained-channels according an embodiment of the invention.

As shown in FIG. 11, a substrate 600 is provided, including a first MOS transistor 300 and a second transistor 400 formed thereon. Herein, the first and second MOS transistors 300 and 400 are formed with different conductivity types. For the purpose of explanation, the first MOS transistor 300 is an NMOS transistor and the second MOS transistor 400 is a PMOS transistor. Fabrication of the first and second MOS transistors 300, 400 can be achieved by conventional CMOS device processes and is not discussed herein, for simplicity. The NMOS transistor 300 is formed on and in a portion of the substrate 600 defined by a pair of isolation structure 302 therein, including a gate stack G comprised of a gate dielectric layer 304 and a gate electrode 306 sequentially formed on the substrate 600 and a pair of spacers 314 formed on opposing sidewalls of the gate stack G. In addition, the NMOS transistor 300 includes a pair of source/drain regions 312, each comprising a source/drain extension region 312a and a heavily doped source/drain region 312b, oppositely formed in the substrate 600 adjacent to the gate stack G, thereby defining a channel region 350 therebetween in the substrate 600. The source/drain regions 312 are now doped with N-type dopants.

Moreover, as shown in FIG. 11, the PMOS transistor 400 is formed over a portion of the substrate 600 defined by isolation structure 402 formed in the substrate 600, including components similar to that of the NMOS transistor 300, such as a gate stack G comprised of a gate dielectric layer 404 and a gate electrode 406 sequentially formed on a portion of the substrate 600 and a pair of spacers 414 formed on opposing sidewalls of the gate stack G. In addition, the PMOS transistor 400 includes a pair of source/drain regions 412, each including a source/drain extension region 412a and a heavily doped source/drain region 412b, oppositely formed in the substrate 600 adjacent to the gate stack G, thereby defining a channel region 450 therebetween in the substrate 600. The source/drain regions 412 are now doped with P-type dopants.

Figure 12:
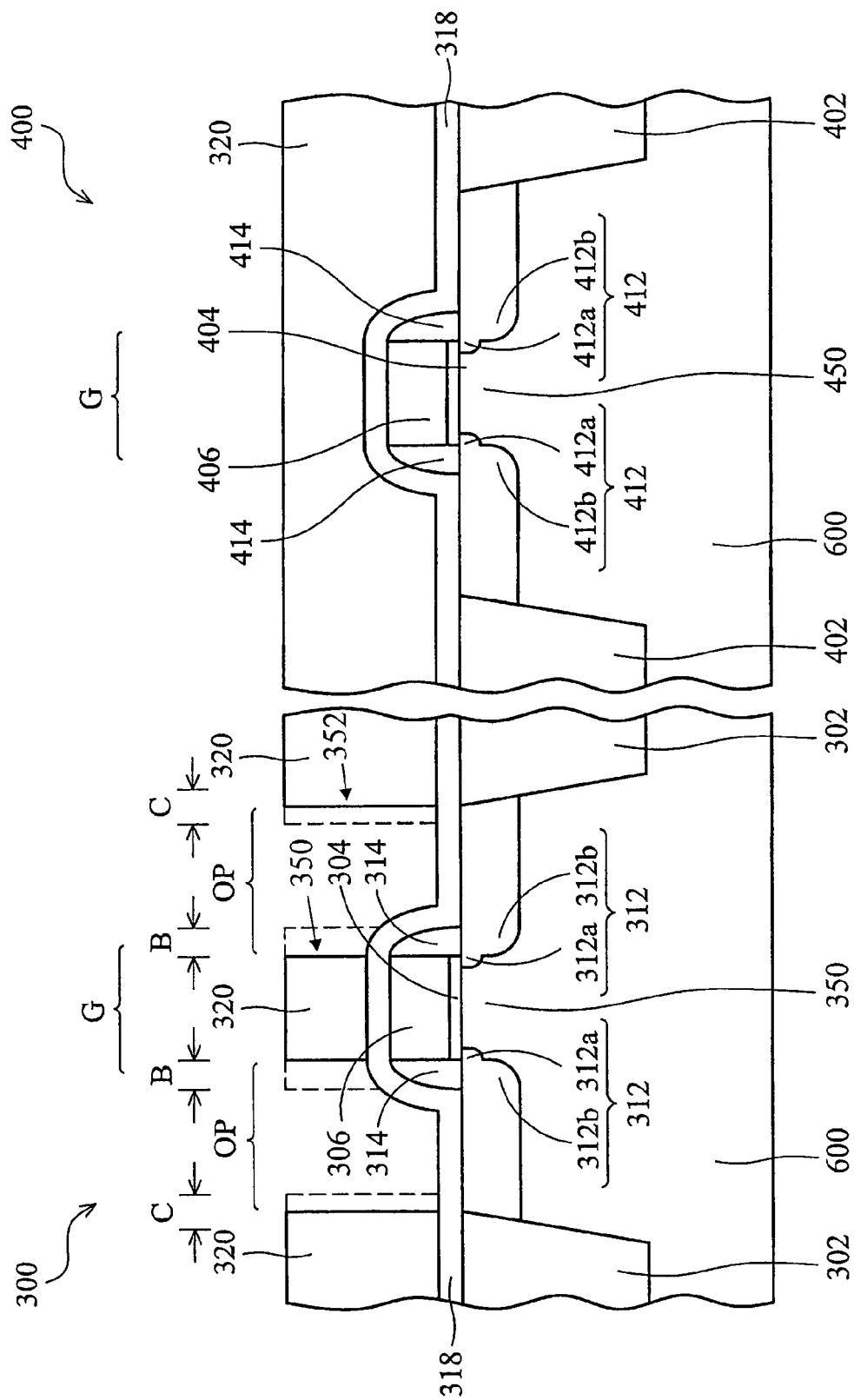

Next, as shown in FIG. 12, a passivation layer 318 is conformably formed over the substrate 600, covering the NMOS and PMOS transistors 300, 400. A resist layer 320 is then blanketly formed over the passivation layer 318 and portions of the resist layer 320 overlying the NMOS transistor 300 are patterned by, for example, photolithography process (not shown), thereby forming a plurality of openings OP, each exposing portions of the passivation layer 318 on opposite sides of the gate stack G of the NMOS transistor 300. As described above, the passivation layer 318 is formed with a thickness of about 20 Å to 250 Å and can be formed by methods such CVD. The passivation layer 318 may comprise silicon oxide, silicon nitride, silicon oxynitride, or combinations thereof. Herein, the part of the patterned resist layer 320 formed over the gate stack G of the NMOS transistor 300 at least covers a portion of the passivation layer 318 overlying the gate electrode 306 of the gate stack G thereof, having an edge 350 substantially formed between the interior and outer edges of the spacers 314 corresponding to the gate stack G, shown as a region B in FIG. 12. In addition, the part of the patterned resist layer 320 formed over the isolation region 302 at least covers the passivation layer 318 over thereof, having an edge 352 substantially formed between an edge of the isolation region 302 corresponding to the gate stack G and may further extend toward the gate stack G, shown as a region C in FIG. 12. The region B has a width of about 230 Å to 600 Å corresponding to an edge of the gate electrode 306 and the region C has a width of about −900~900 Å corresponding to an edge of the isolation region 302. Therefore, formation of such a patterned resist layer 320 over the NMOS transistor 300 allows wider overlay windows and can be achieved by conventional photolithography techniques. This is particular an advantage while a width of the gate stack G is reduced to micrometer dimension.

Figure 13:
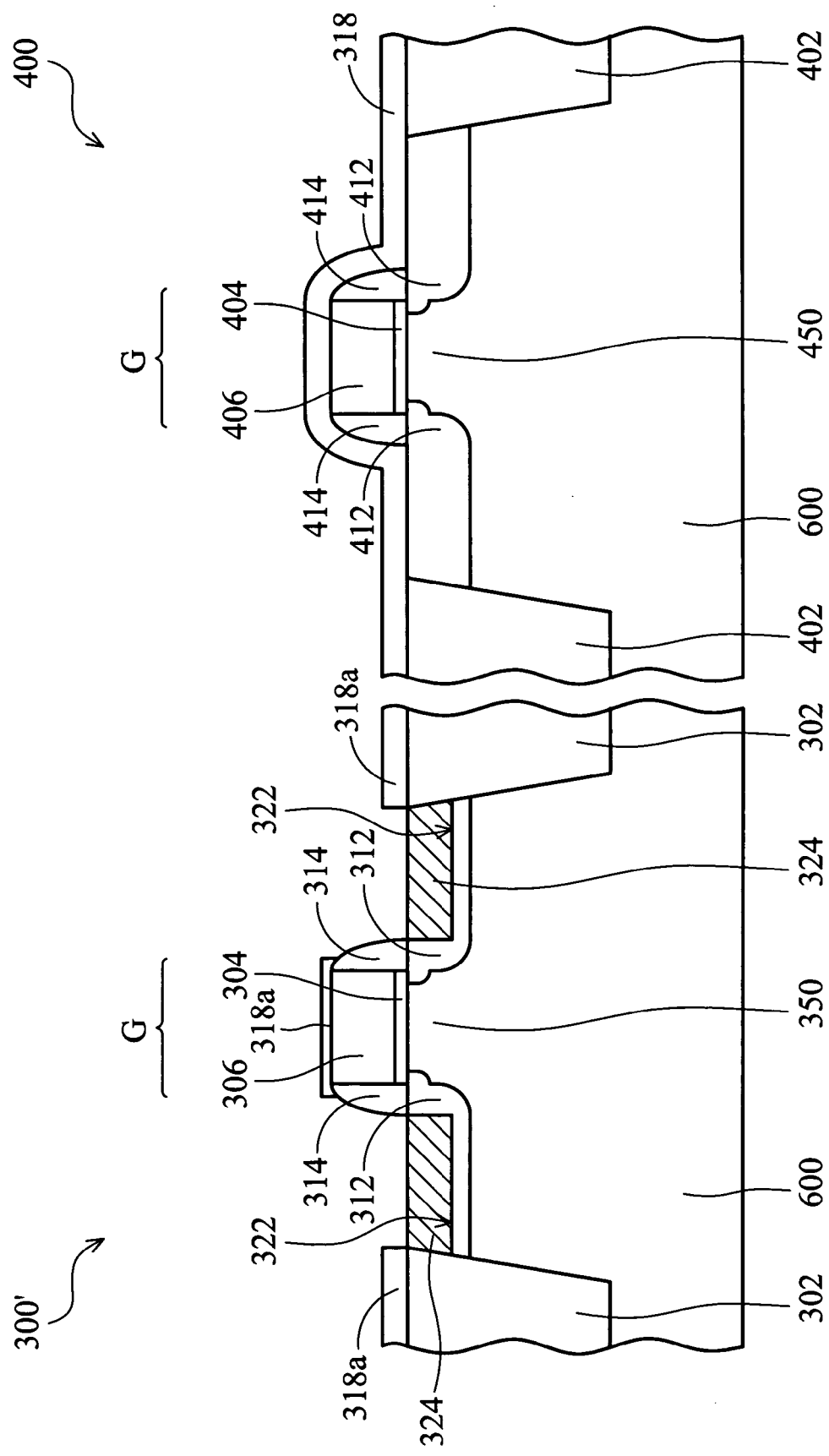

Next, as shown FIG. 13, an etching (not shown) is next performed and the passivation layer 318 overlying the NMOS transistor 300 and portions of the substrate 600 exposed by the openings OP are removed, respectively forming a recess 322 in each of the source/drain regions 312 of the NMOS transistor 300. During the above etching, the resist layer 320 (not shown) and the passivation layer 318 thereunder are partially etched and the remaining passivation layer 318a is left over only a portion of the gate stack G and the spacers 314 of the NMOS transistor 300, and over the isolation regions 302 after removal of the resist layer 320. At this time, an edge of the recess 322 aligns to the outer edge of the spacers 314 and another edge of the recess 322 substantially aligns to an edge of the isolation region 302. In addition, the recesses 322 are then filled with a semiconductor material 324 having a different natural lattice constant than that of the substrate 600 through an selective deposition process (not shown) such as chemical vapor deposition, ultra-high vacuum chemical vapor deposition (UHV-CVD), or molecular beam epitaxy, functioning as stressors for exerting strain to the channel region 350 between the source/drain regions 312. The semiconductor material 324 can be elemental, alloy or compound semiconductor and is preferably an alloy semiconductor material including silicon and germanium, silicon and carbon or the combination of silicon, germanium and carbon. During the above selective deposition process for filling the recesses 322, the remaining passivation layer 318a prevents undesired selective deposition near the gate electrode 306, thus no gate electrode with mushroom issues is formed. In addition, during the selective deposition process for filling of the second semiconductor material 324, dopants of a second conductive type are in-situ doped in the semiconductor material 324 with similar concentration and the doping concentration of the source/drain regions 312 therein can therefore be maintained. Thus, an NMOS transistor 300' with a strained channel region 350 is formed, as shown in FIG. 13.

Figure 14:
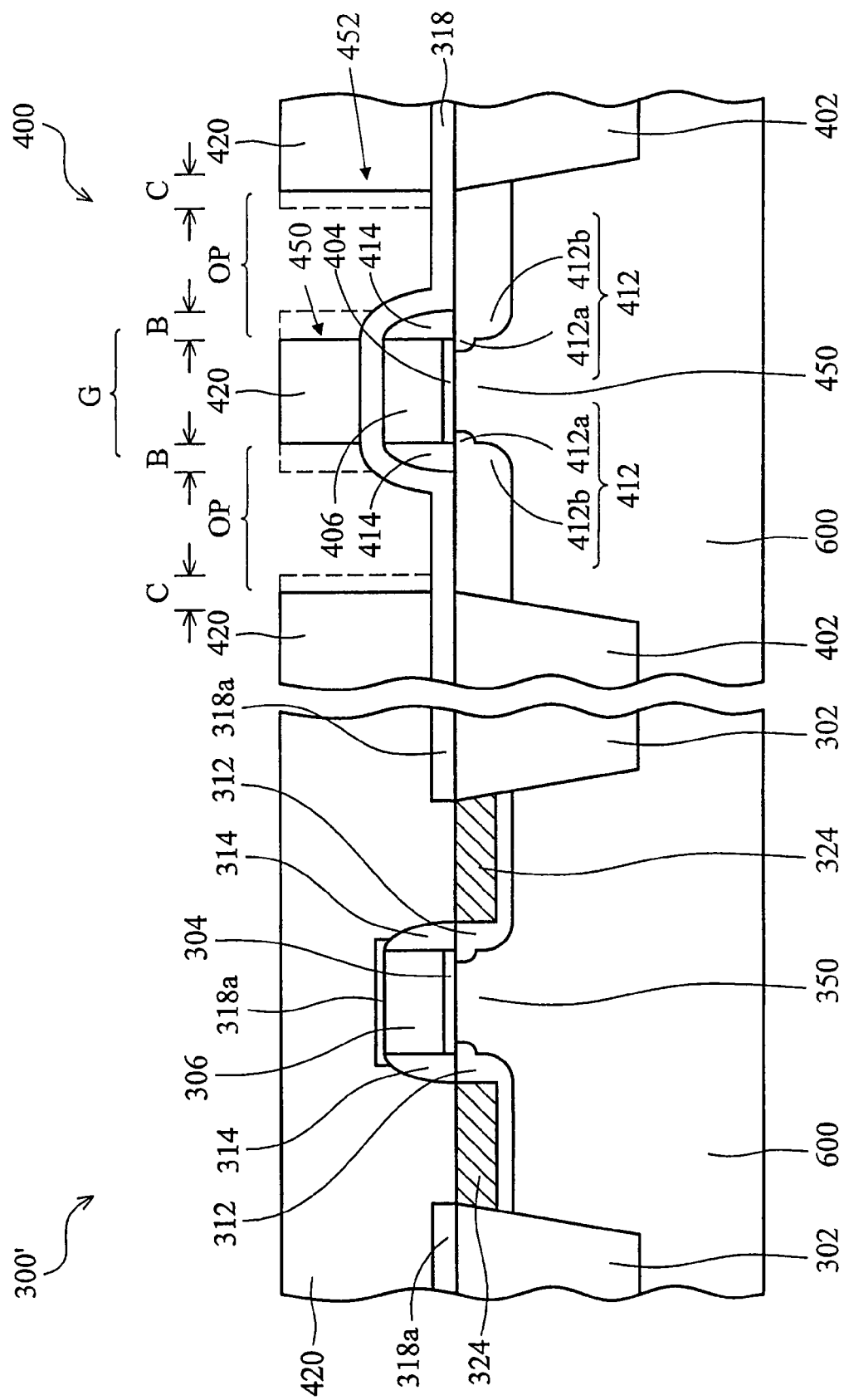

Next, as shown in FIG. 14, another resist layer 420 is blanketly formed, covering the passivation layer 318 over the PMOS transistor 400 and the NMOS transistor 300' with remaining passivation layer 318a thereon. The resist layer 420 is then patterned and portions of the resist layer 420 overlying the PMOS transistor 400 are removed, thereby forming a plurality of openings OP therein, exposing portions of the passivation layer 318 on opposite sides of the gate stack G of the PMOS transistor 400. Herein, the part of the patterned resist layer 420 formed over the PMOS transistor 400 at least covers the passivation layer 318 over the gate electrode 406 of the gate stack G thereof, having an edge 450 substantially formed between the interior and outer edges of the spacers 414 corresponding to the gate stack G, shown as a region B in FIG. 14. In addition, the part of the patterned resist layer 420 formed over the isolation region 402 at least covers the passivation layer 318 over thereof, having an edge 452 substantially formed on an edge of the isolation region 402 corresponding to the gate stack G and may further extend toward the gate stack G, shown as a region C in FIG. 14. The region B has a width of about 230 Å to 600 Å corresponding to an edge of the gate electrode 406 and the region C has a width of about −900~900 Å corresponding to an edge of the isolation region 402. Therefore, formation of such a patterned resist layer 420 over the PMOS transistor 400 allows wider overlay windows and can be achieved by conventional photolithography techniques. This is particular an advantage while a width of the gate stack G is reduced to micrometer dimension.

Figure 15:
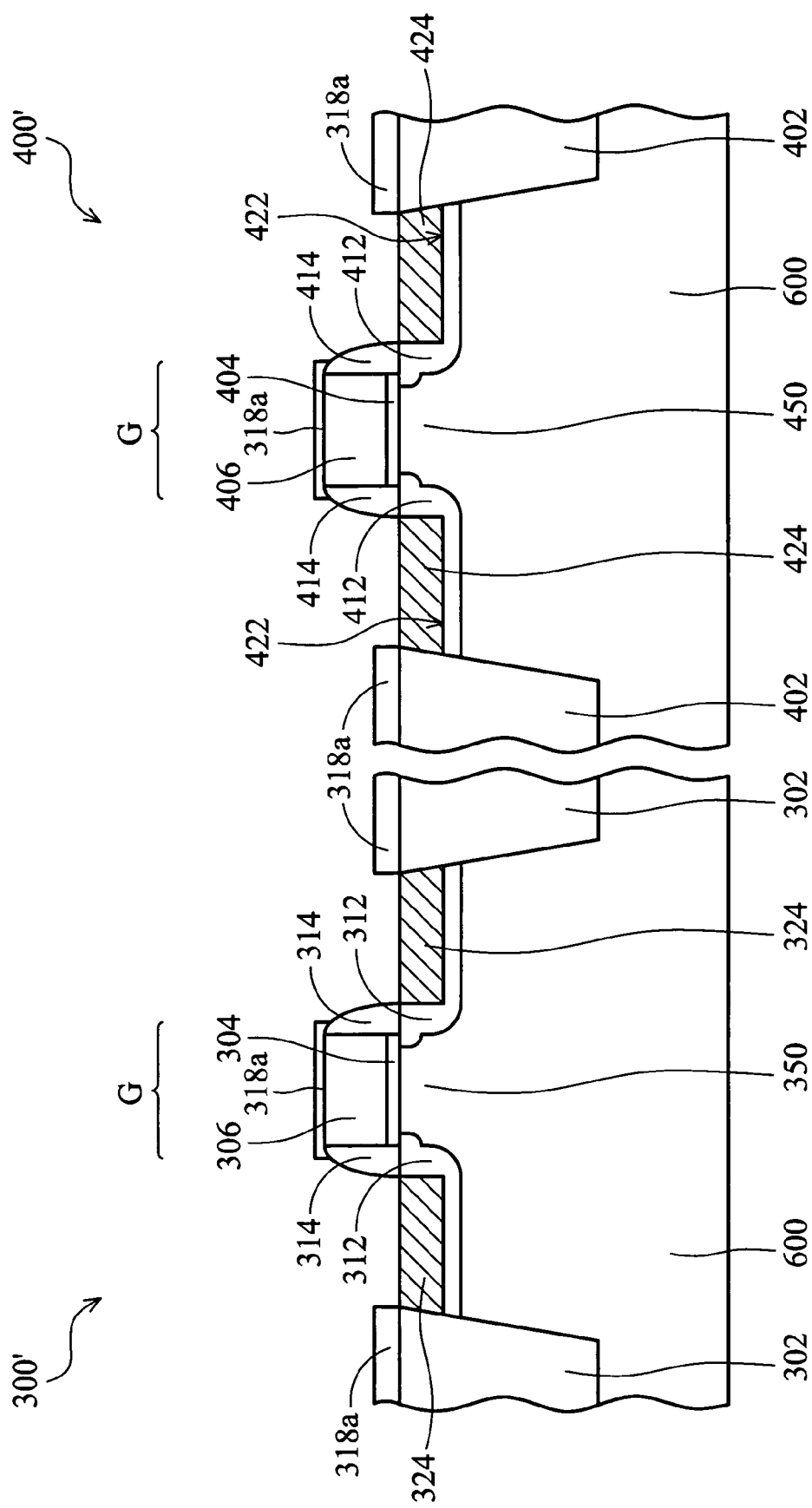

Next, as shown FIG. 15, an etching (not shown) is next performed and the passivation layer 318 overlying the PMOS transistor 400 and portions of the substrate 600 exposed by the openings OP are removed, respectively forming a recess 422 in each of the source/drain regions 412 of the PMOS transistor 400. At this time, an edge of the recess 422 aligns to the outer edge of the spacers 414 and another edge of the recess 422 substantially aligns to an edge of the isolation region 402. During the above etching, the resist layer 420 (not shown) and the passivation layer 318 thereunder are partially etched and the remaining passivation layer 318a is left over only a portion of the gate stack G and the spacers 414 and the isolation regions 402 after removal of the resist layer 420. In addition, the recesses 422 are then filled with a semiconductor material 424 having a different natural lattice constant than that of the substrate 600 through an selective deposition process (not shown) such as chemical vapor deposition, ultra-high vacuum chemical vapor deposition (UHV-CVD), or molecular beam epitaxy, functioning as stressors for exerting strain to the channel region 450 between the source/drain regions 412. The semiconductor material 424 can be elemental, alloy or compound semiconductor and is preferably an alloy semiconductor material including silicon and germanium, silicon and carbon or the combination of silicon, germanium and carbon. During the above selective deposition process for filling the recesses 422, the remaining passivation layer 318a prevents undesired selective deposition near the gate electrode 406, thus no gate electrode with mushroom issues is formed. In addition, during the selective deposition process for filling of the second semiconductor material 422, dopants of a second conductive type are in-situ doped in the semiconductor material 424 with similar concentration and the doping concentration of the source/drain regions 412 therein can therefore be maintained. Thus, a PMOS transistor 400' with a strained channel region 450 is formed, as shown in FIG. 15.

Figure 16:
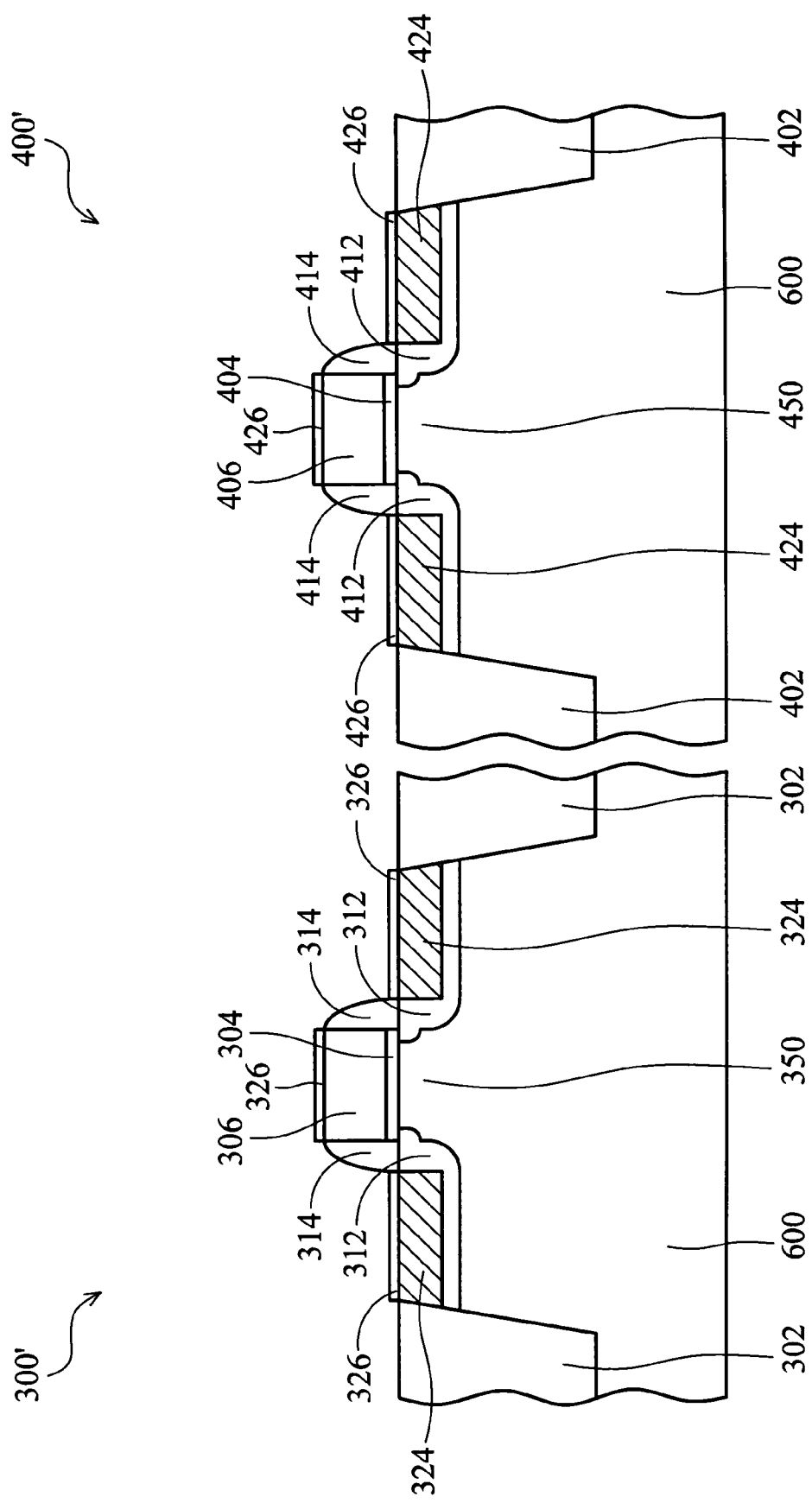

Referring to FIG. 16, the remaining passivation layers 318a over the transistors are next removed and a conventional silicide process (not shown) can be optionally performed to respectively form a metal silicide layers 326/426 over the gate electrode layer 306/406 and the surface of the source/drain regions 312/412 of the NMOS/PMOS transistor 300'/400' for the purpose of reducing contact resistances of the source/drain regions and the gate electrode. Thus, through illustrations of FIGS. 11-16, fabrication of a CMOS device with strained channels is described.

Through the method illustrated in FIGS. 11-16, an exemplary CMOS device having strained channel region 350 and 450 but without the mentioned mushroom issue is obtained. In the PMOS transistor 400' having strained channel 450 shown in FIGS. 15 and 16, the substrate 600 preferably comprises silicon and the second semiconductor material 424 preferably comprises a semiconductor material such as a silicon-germanium (SiGe), with a natural lattice constant greater than that of substrate 600. The second semiconductor material 424 now functions as a stressor and exerts a compressive stress (not shown) in a lateral source/drain direction and tensile stress (not shown) in a vertical direction in the substrate 600 of the strained-channel region, resulting in strained channel region 450 under a compressive strain in the source/drain direction and tensile strain in the vertical direction. Hole mobility in the strained-channel region 450 is significantly enhanced, enhancing the drive current of the PMOS transistor 400.

Further, in the NMOS transistor 300' having strained channel 350 shown in FIGS. 15 and 16, the substrate 600 preferably comprises silicon and the second semiconductor material 324 preferably comprises silicon-carbon (SiC), with a natural lattice constant smaller than that of substrate 600. Therefore, the second semiconductor material 324 now functions as a stressor and exerts a tensile stress (not shown) in a lateral source/drain direction and compressive stress (not shown) in a vertical direction on the strained channel region 350, resulting in strained channel region 350 under a tensile strain in the lateral source/drain direction and compressive strain in the vertical direction. Electron mobility in the strained-channel region 350 is significantly enhanced, enhancing the drive current of the NMOS transistor with strained-channel transistor.

Through illustration of above exemplary embodiments, methods for forming transistors having strained channel are described but are not limited to the MOS transistors illustrated in FIGS. 5-10 and 11-16. The above illustrated method is also applicable in fabrications of other type transistors and is known to those skilled in the art. Fabrications of the transistors rather than MOS transistors are not illustrated here again, for simplicity.

While the invention has been described by way of example and in terms of the preferred embodiments, it is to be understood that the invention is not limited to the disclosed embodi-

What is claimed is:

1. A method for forming a strained channel in a semiconductor device, comprising:
   providing a transistor, comprising:
      a gate stack exposed with a gate electrode on a semiconductor substrate;
      a pair of source/drain regions in the substrate on opposite sides of the gate stack;
      a pair of spacers on opposing sidewalls of the gate stack;
   forming a passivation layer covering the gate electrode and the spacers;
   forming a resist pattern on a portion of the passivation layer;
   performing an etching by using the resist pattern as an etching mask to the passivation layer and the semiconductor substrate, forming a recess region in each of the source/drain regions and leaving a patterned passivation layer covering portions of the gate electrode and the spacers, wherein an edge of the recess region aligns to an outer edge of the spacers and the patterned passivation layer does not cover entire sidewalls of the spacers and a top surface of the semiconductor substrate; and
   after performing the etching, then directly filling the recess regions with a strain-exerting material, thereby forming a strained channel region in the semiconductor substrate between the source/drain regions.

2. The method as claimed in claim 1, further comprising removing the patterned passivation layer covering the gate electrode and the spacers.

3. The method as claimed in claim 2, further comprising forming a metal silicide layer over the source/drain regions and the gate electrode.

4. The method as claimed in claim 1, wherein the MOS transistor is a PMOS transistor and the strain-exerting material has a natural lattice constant greater than that of the semiconductor substrate.

5. The method as claimed in claim 4, wherein the strain-exerting material comprises SiGe and the semiconductor substrate comprises Si.

6. The method as claimed in claim 1, wherein the MOS transistor is a NMOS transistor and the strain-exerting material has a natural lattice constant smaller than that of the semiconductor substrate.

7. The method as claimed in claim 6, wherein the strain-exerting material comprises SiC and the semiconductor substrate comprises Si.

8. The method as claimed in claim 1, wherein during filling of the strain-exerting material in the recess regions, the strain-exerting material is in-situ doped dopants of the same conductivity type and in similar concentration as that of the source/drain regions.

9. A method for forming a strained channel in a semiconductor device, comprising:
   providing a transistor, comprising:
      a gate stack exposed with a gate electrode on a semiconductor substrate;
      a pair of source/drain regions in the substrate on opposite sides of the gate stack;
      a pair of spacers on opposing sidewalls of the gate stack;
   forming a conformal passivation layer over the semiconductor substrate, the spacers and the gate stack;
   forming a resist pattern on a portion of the passivation layer, substantially covering the gate stack, wherein edges of the resist pattern forms between to an outer and an inner edge of the spacers corresponding to the gate stack;
   etching the passivation layer and the semiconductor substrate exposed by the resist pattern by using the resist pattern as an etching mask, forming a recess region in each of the source/drain regions, wherein an edge of the recess region aligns to the outer edge of the spacers;
   removing the resist pattern, leaving a patterned passivation layer covering portions of the gate electrode and the spacers, wherein the patterned passivation layer does not cover entire sidewalls of the spacers and a top surface of the semiconductor substrate; and
   filling the recess regions with a strain-exerting material, thereby forming a strained channel region in the semiconductor substrate between the source/drain regions.

10. The method as claimed in claim 9, further comprising removing the patterned passivation layer covering the gate electrode and the spacers.

11. The method as claimed in claim 9, wherein the MOS transistor is a PMOS transistor and the strain-exerting material has a natural lattice constant greater than that of the semiconductor substrate.

12. The method as claimed in claim 11, wherein the strain-exerting material comprises SiGe and the semiconductor substrate comprises Si.

13. The method as claimed in claim 9, wherein the MOS transistor is a NMOS transistor and the strain-exerting material has a natural lattice constant smaller than that of the semiconductor substrate.

14. The method as claimed in claim 13, wherein the strain-exerting material comprises SiC and the semiconductor substrate comprises Si.

15. The method as claimed in claim 9, wherein during filling of the strain-exerting material in the recess regions, the strain-exerting material is in-situ doped dopants of the same conductivity type and in similar concentration as that of the source/drain regions.

16. A method for forming a transistor with a strained channel, comprising:
   providing a semiconductor substrate with a gate stack over a part thereof, wherein the gate stack comprises a gate dielectric layer, a gate electrode and a mask layer sequentially formed over the semiconductor substrate;
   forming a pair of lightly doped source/drain regions in the semiconductor substrate on opposite sides of the gate stack;
   removing the mask layer to expose the gate electrode of the gate stack;
   forming a pair of spacers on opposing sidewalls of the gate stack and the semiconductor substrate;
   forming a pair of heavily doped source/drain regions in the semiconductor substrate on opposite sides of the gate stack;
   performing an annealing process on the lightly and heavily doped source/drain regions, forming a pair of source/drain regions the semiconductor substrate on opposite sides of the gate stack;
   forming a conformal passivation layer over the semiconductor substrate, the spacers and the gate electrode;
   forming a resist pattern on a portion of the passivation layer, covering the gate electrode and the spacers, wherein edges of the resist pattern align to outer edges of the spacers from the gate electrode;

etching the passivation layer and the substrate thereunder exposed by the resist pattern by using the resist pattern as an etching mask, forming a recess region in each of the source/drain regions, wherein an edge of the recess region aligns to the outer edge of the spacer;

removing the resist pattern, leaving a patterned passivation layer covering portions of the gate electrode and the spacers, wherein the patterned passivation layer does not cover entire sidewalls of the spacers and a top surface of the semiconductor substrate; and filling the recess regions with a strain-exerting material, thereby forming a transistor with a strained channel region formed in the semiconductor substrate between the source/drain regions thereof.

17. The method as claimed in claim 16, wherein the MOS transistor is a PMOS transistor and the strain-exerting material has a natural lattice constant greater than that of the semiconductor substrate.

18. The method as claimed in claim 17, wherein the strain-exerting material comprises SiGe and the semiconductor substrate comprises Si.

19. The method as claimed in claim 16, wherein the MOS transistor is a NMOS transistor and the strain-exerting material has a natural lattice constant smaller than that of the semiconductor substrate.

20. The method as claimed in claim 19, wherein the strain-exerting material comprises SiC and the semiconductor substrate comprises Si.

* * * * *